US006975104B2

(12) United States Patent
Gregorec, Jr.

(10) Patent No.: US 6,975,104 B2
(45) Date of Patent: Dec. 13, 2005

(54) CLAMP METER WITH DUAL DISPLAY

(75) Inventor: James L. Gregorec, Jr., Sycamore, IL (US)

(73) Assignee: Ideal Industries, Inc., Sycamore, IL (US)

( * ) Notice: Subject to any disclaimer, the term of this patent is extended or adjusted under 35 U.S.C. 154(b) by 12 days.

(21) Appl. No.: 10/783,612

(22) Filed: Feb. 20, 2004

(65) Prior Publication Data

US 2005/0184722 A1 Aug. 25, 2005

(51) Int. Cl.[7] .............................................. G01R 1/38
(52) U.S. Cl. ..................... 324/126; 324/99 D; 324/115
(58) Field of Search ............................ 324/99 D, 115, 324/121 R, 126–127, 156–157, 116–117 R, 324/142–149; 340/660

(56) References Cited

U.S. PATENT DOCUMENTS

| | | | | |
|---|---|---|---|---|
| 3,168,698 A | | 2/1965 | Goody et al. | |
| 3,652,935 A | | 3/1972 | Shaw | |
| 3,768,011 A | | 10/1973 | Swain | |
| 3,806,797 A | | 4/1974 | Harvey | |
| 3,840,808 A | | 10/1974 | Liebermann | |
| 3,893,028 A | | 7/1975 | Febvre et al. | |
| D242,608 S | | 12/1976 | Melvin | |
| D242,609 S | | 12/1976 | Melvin | |
| 4,071,824 A | | 1/1978 | Kernander et al. | |
| 4,100,488 A | | 7/1978 | Quietzsch et al. | |
| D264,057 S | | 4/1982 | Kuramoto | |
| 4,366,434 A | | 12/1982 | Ellis | |
| 4,476,721 A | | 10/1984 | Hochreuther et al. | |
| D292,177 S | | 10/1987 | Dong-Chang | |
| D292,496 S | | 10/1987 | Arnoux et al. | |
| 5,349,289 A | * | 9/1994 | Shirai | 324/127 |
| D358,349 S | | 5/1995 | Kuramoto | |
| 5,610,512 A | * | 3/1997 | Selcuk | 324/127 |
| 5,686,831 A | | 11/1997 | Vandervalk | |
| D396,657 S | | 8/1998 | Nagai et al. | |
| 6,259,241 B1 | | 7/2001 | Krantz | |
| D452,659 S | | 1/2002 | Harju et al. | |
| 6,456,060 B1 | * | 9/2002 | Wiesemann | 324/127 |
| 2002/0101230 A1 | | 8/2002 | Gregorec, Jr. et al. | |

FOREIGN PATENT DOCUMENTS

EP 913695 B1 5/2003

* cited by examiner

*Primary Examiner*—Vinh P. Nguyen
(74) *Attorney, Agent, or Firm*—Cook, Alex, McFarron, Manzo, Cummings & Mehler, Ltd.

(57) ABSTRACT

A clamp type digital multimeter has one or more digital displays mounted so as to permit at least one of the displays to be read even when attachment of the clamp jaws about a conductor forces the display into an orientation that renders it inaccessible. The meter either has a single display that can be pivoted to an orientation convenient for viewing, or it has dual displays mounted on separate surfaces of the meter's housing. A protective flap may cover one or both of the displays when it is not needed for viewing.

20 Claims, 2 Drawing Sheets

CLAMP METER WITH DUAL DISPLAY

BACKGROUND OF THE INVENTION

This invention relates generally to electronic test instruments, particularly digital multimeters having a current sensing clamp. Digital multimeters, or DMM's, are used to measure a variety of electrical parameters, such as AC voltage, DC voltage, resistance and current. Clamp-type DMMs, also known simply as clamp meters, can measure current without interfering with the current carrying conductor. One such clamp meter is described in U.S. patent application Ser. No. 09/774,526, the disclosure of which is hereby incorporated by reference. In addition, clamp meters have the ability to measure fairly high levels of current.

Clamp meters measure current flow in a conductor without having to make electrical connection with the conductors forming the circuit. Instead two clamp jaws having electrical coils embedded therein encircle the conductor and sense the magnetic field created by the current flow in order to measure the current. However, the physical arrangement of the measured conductor in relation to the clamp jaws, housing and display dictates the orientation in which the clamp meter must be used. This can make it difficult to read the display in certain situations.

Typically, clamp meters have an elongated rectangular housing designed to be held in one hand. A pair of clamp jaws extends from the top of the housing. The jaws are situated in a fixed plane that is generally parallel to the plane of the front face of the housing. The meter's display is normally also disposed in the front face of the housing. Accordingly, when the clamp jaws are placed around a conductor the display can be forced into a position which may make reading the display difficult, if not impossible. This occurs most often when the current-carrying conductor is overhead or disposed in tight physical spaces such as an electrical cabinet.

It has been determined that adding a display to the side of a multimeter housing disposed on a plane generally perpendicular to the plane formed by the clamp jaws facilitates the reading of measurements even when the clamp meter is in an awkward position dictated by the need to surround a current-carrying conductor.

SUMMARY OF THE INVENTION

A primary object of the present invention is a clamp meter having multiple displays mounted in separate planes. At least one of the displays will be readily visible regardless of the orientation of the meter. The clamp meter has a housing having at least first, second and third faces. A pair of rigid jaws extends from the first face of the housing. The jaws define a jaw plane with at least one rigid jaw being pivotally movable in the jaw plane. A first display is disposed on the second face of the housing in a plane approximately parallel to the jaw plane. A second display is disposed on the third face of the housing in a plane approximately perpendicular to the jaw plane. One of the displays may be selectably covered by a pivotable flap.

In an alternate embodiment a single display is pivotally mounted in the housing so it can be tilted to a suitable viewing position.

DETAILED DESCRIPTION OF THE INVENTION

Figure 1:
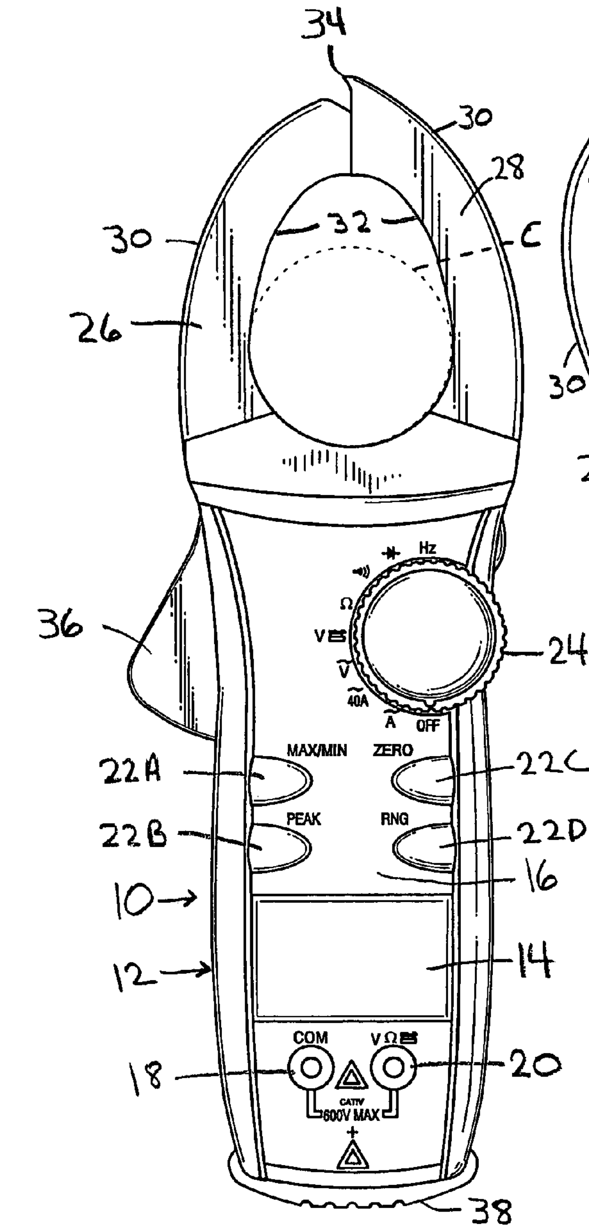
FIG. 1 is a front elevation view of a clamp meter of the present invention, with the clamp jaws closed to encircle a conductor shown in phantom lines.

FIGS. 1–4 illustrate a clamp meter 10 according to the present invention. The clamp meter has an elongated housing 12 that mounts a first digital display 14. The display is mounted such that its outer surface is generally contiguous with the front face 16 of the housing. Two input jacks 18, 20 are provided for receiving test leads (not shown). The housing 12 is made from a hard, durable, lightweight plastic material. Also included on the front face 16 is a series of pushbuttons 22A–22D for selecting one or more of the testing functions of the meter. A selector knob or dial 24 is disposed on the front face 16 for choosing an electrical measurement mode.

Extending from the top of the housing is a pair of rigid clamp jaws 26, 28. Typically one of the jaws is pivotally mounted in the housing. In the embodiment shown jaw 26 is movable. Jaw 26 is spring-biased to a closed position against fixed jaw 28. The jaws 26, 28 have an arcuate shape to present outer convex surfaces 30 and inner concave surfaces 32. The ends of the outer surfaces are slightly offset to form a tip 34 at the end of fixed jaw 28. Tip 34 permits manipulation of electrical wires. Inside the jaws are electrical coils (not shown) which are connected to appropriate circuitry in the housing for detecting electrical properties of a conductor placed within the clamp jaws. These coils and circuitry are conventional. The internal circuitry displays the selected parameter on the displays.

Figure 2:
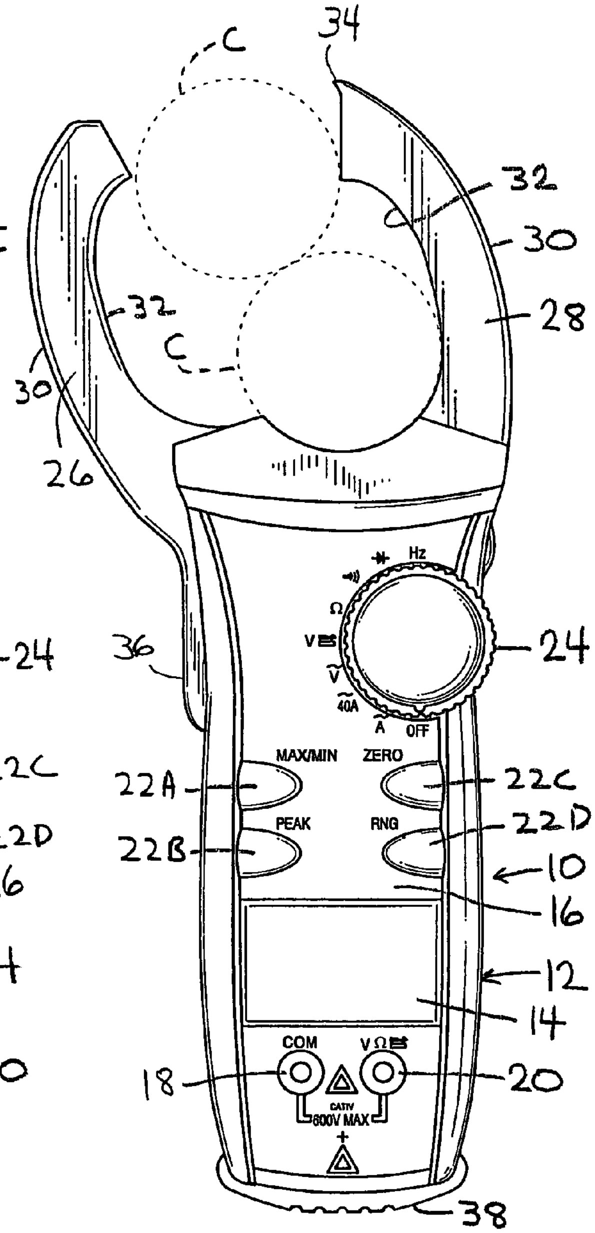
FIG. 2 is a front elevation view of a clamp meter of the present invention, with the clamp jaws open.

A trigger 36 extends from the side of the housing 12 and is attached to the movable jaw. Preferably, as shown in FIG. 2, the trigger 36 is integrally formed with the movable jaw 26. Depressing the trigger 36 toward the housing causes the movable jaw 26 to pivot away from the fixed jaw 28 and move to the open position, as shown in FIG. 2. Once the clamp jaw 26 is in the open position, the multimeter 10 can be positioned to pass the jaws 26, 28 around a conductor. This is illustrated schematically in FIG. 2 where the conductor C is shown in two different positions; one just as it clears the opening between the jaws 26, 28 and one where it is seated against the top of the housing 12. When the trigger 36 is released, movable clamp jaw 26 closes around the conductor C, as shown in FIG. 1, to permit a current measurement to be taken. The clamp jaws 26, 28 can be designed to accommodate a number of different conductor diameters. Although conductor C is shown contacting the inner surfaces 32 of jaws 26, 28 in FIG. 1, it is not necessary that they do so. However, in order to measure the current carried by a conductor, the clamp jaws 26, 28 must surround the conductor as shown in FIG. 1.

Figure 3:
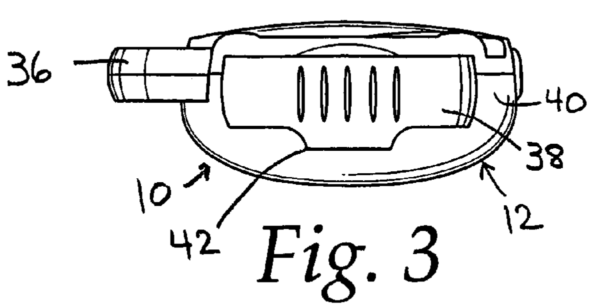
FIG. 3 is a bottom plan view of the clamp meter of the present invention, showing a protective flap in a closed position for covering a display.
Figure 4:
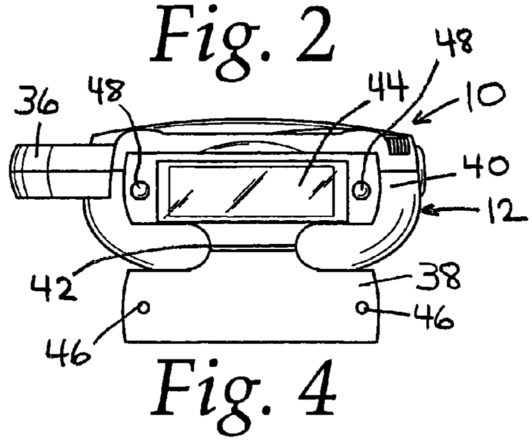
FIG. 4 is a bottom plan view of the clamp meter of the present invention, showing the protective flap in an open position to expose a display.

A protective flap 38 is included on the bottom face 40 of the housing, as shown in FIGS. 3 and 4. Flap 38 is connected to the housing by a hinge 42. A second digital display 44 is mounted in the housing on the bottom face. When the flap 38 is closed it protects the second display 44. Two flexible beads 46 engage indentations 48 in the bottom face 40 to frictionally retain the flap in the closed position.

Second display 44 lies in a plane approximately perpendicular to the plane defined by the clamp jaws and to the plane defined by the front face 16 of the housing. Accordingly, the second display 44 is generally perpendicular to the plane of the first display 14. This arrangement of first display 14 and second display 44 permits a measurement to be read even when the clamp meter is forced into an awkward or difficult viewing position by the necessary placement of the clamp jaws. If the position of the clamp meter affords the user a decent view of the first display 14, the flap 38 may remain closed. However, if the location of a conductor requires placement of the clamp meter housing in a position where the first display 14 is obscured or otherwise unavailable for viewing, the flap 38 may be opened to expose the second display 44. Second display 44 provides a readout of the same data as in first display 14. Thus, regardless of the orientation of the clamp meter housing, one of the displays will be readily visually accessible.

Figure 5:
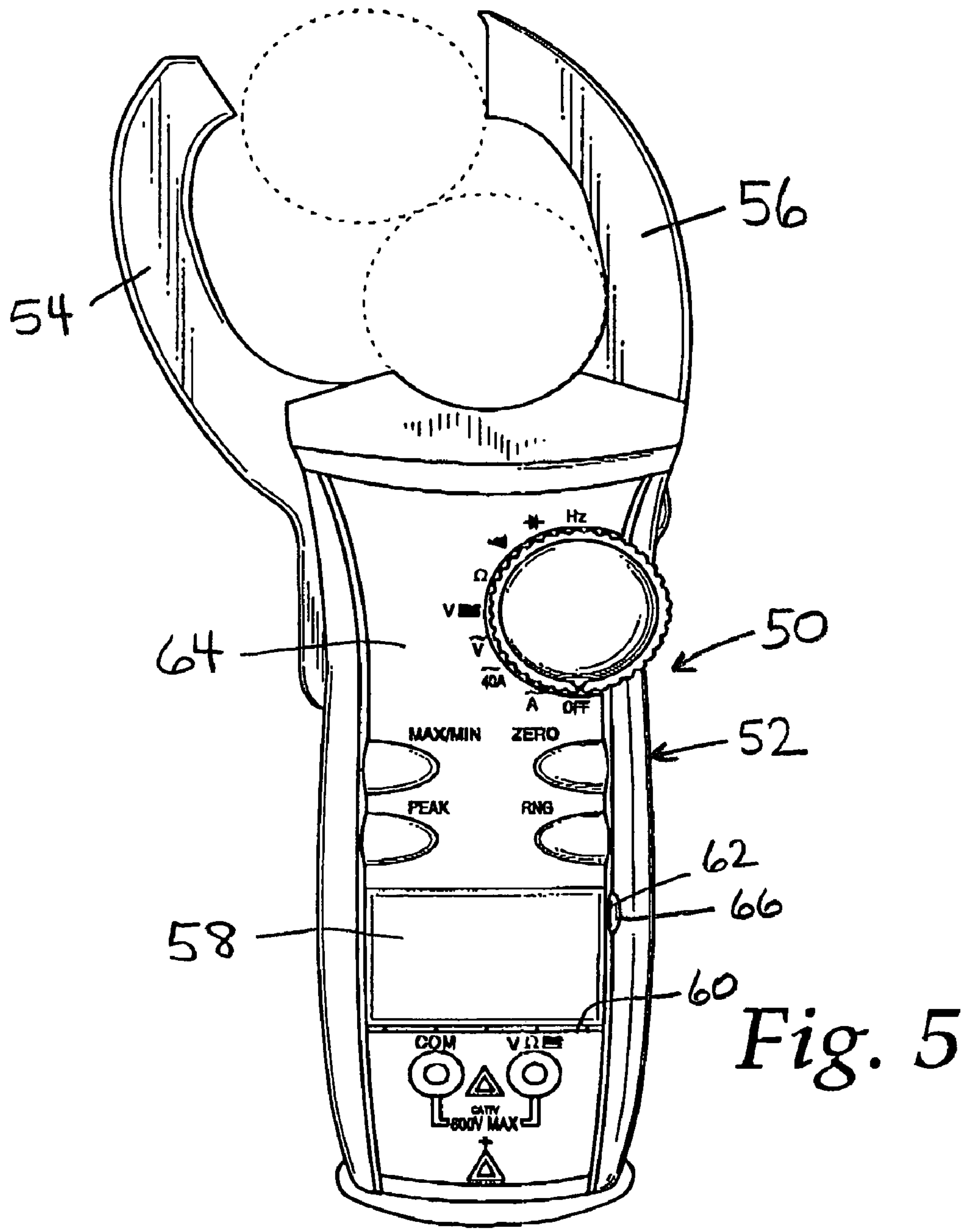
FIG. 5 is a front elevation view of a second embodiment of a clamp meter according to the present invention, with the clamp jaws open to receive a conductor shown in phantom lines and the display shown in a retracted position.
Figure 6:
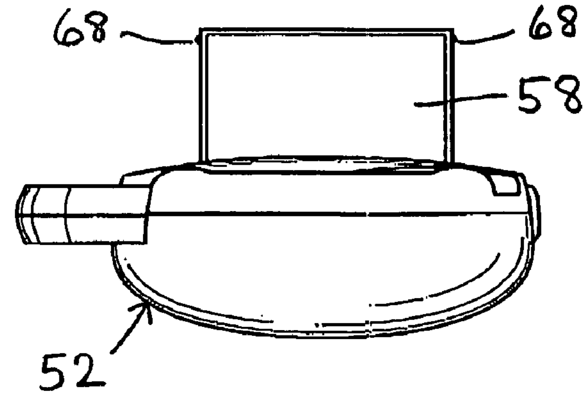
FIG. 6 is a bottom plan view of the clamp meter of FIG. 5, with the display shown in a raised position.

A second embodiment of a multimeter 50 according to the present invention is shown in FIGS. 5 and 6. Multimeter 50 has a housing 52 with clamp jaws 54 and 56 extending from one end. The jaws 54, 56 are the same as jaws 26, 28. The knob, jacks and buttons of the housing 52 are the same as those described above. Housing 52 itself is similar to housing 12 except that instead of two displays lying in perpendicular planes, multimeter 50 has a single pivoting display 58 connected to the housing 52 by a hinge 60. Preferably the display 58 when in a retracted position is disposed in a recess 62 of the front face 64 of the housing 52. The display 58 is shown in FIG. 5 in a retracted position so that the display defines a plane that is substantially parallel to the plane defined by the clamp arms 54, 56. In FIG. 6, the display 58 is shown in a fully raised position such that the plane defined by the display is substantially perpendicular to the clamp arm plane. A depression 66 is provided in the housing to permit a user's thumb or finger to access the display 58 so that it can be raised out of the recess 62.

A flexible electrical connection to the display is provided. The electrical connection is arranged to accommodate the pivoting motion of the display. A flexible polyester film with printed electrodes thereon would be suitable for this purpose.

Preferably, hinge 60 has sufficient friction or stiffness to hold or retain the display 58 in a multitude of positions relative to the clamp plane, from fully upright and perpendicular to the clamp plane to fully recessed and parallel to the clamp plane and every angle in between. In other words, the hinge is loose enough to permit a user to tilt the display from one angle to another but stiff enough to prevent the display from moving out of position by gravity or normal movement of the multimeter. As shown in FIG. 6, the display 58 may also include protruding detents 68 on both sides of the display. The housing recess 62 includes complementary notches (not shown) that are engaged by the detents to frictionally retain the display in the recess.

Alternatively, a torsion spring (not shown) could be used to bias the display 58 to an upright or raised position as shown in FIG. 6. In that case a catch or latch would be formed on or in the housing. The latch could be released by a trigger mechanism on the side of the housing. When engaged the latch would hold the display in the retracted position against the biasing force of the torsion spring. A further alternate would be to hold the display in an upright position by means of a releasable support arm. In addition, although a piano-type hinge is shown, the hinge could have other configurations and the display may be pivotally attached to the housing in any number of ways known to those skilled in the art. Yet another alternate would be to pivotally attach the display 58 to the bottom face of the housing.

Although the invention has been described with reference to certain preferred embodiments, the invention is not meant to be limited to those preferred embodiments. Alterations to the preferred embodiments described are possible without departing from the spirit of the invention. Rather the scope of the invention is defined by reference to the appended claims.

I claim:

1. A clamp meter for measuring electrical parameters in a conductor, comprising:

a) a housing having at least first, second and third faces;

b) a pair of rigid jaws extending from the first face of the housing, the jaws defining a jaw plane, at least one of the jaws being pivotally movable in the jaw plane;

c) a first display disposed on the second face of the housing in a plane approximately parallel to the jaw plane; and d) a second display disposed on the third face of the housing in a plane approximately perpendicular to the jaw plane.

2. The clamp meter of claim 1 further comprising a lever attached to said one jaw for moving it from a closed position wherein the pair of jaws contact one another to an open position wherein the pair of jaws are spaced apart.

3. The clamp meter of claim 2 wherein housing further comprises a fourth face and the lever extends from the fourth face of the housing.

4. The clamp meter of claim 1 further comprising a selector knob disposed on the second face of the housing, for selecting a measurement mode.

5. The clamp meter of claim 4 wherein the measurement mode comprises a voltage mode, a resistance mode, and a current mode.

6. The clamp meter of claim 4 wherein said selector knob extends beyond an edge of said housing.

7. A clamp meter for measuring electrical parameters, comprising:

a) a housing;

b) a pair of rigid clamp jaws extending from the housing, the clamp jaws defining a clamp plane with at least one clamp jaw being pivotally movable in the clamp plane;

c) a first display mounted in the housing;

d) a second display disposed in the housing in a plane generally perpendicular to the clamp plane.

8. The clamp meter of claim 7 further comprising a lever attached to said one clamp jaw for moving it from a closed position wherein the pair of clamp jaws contact one another to an open position wherein the pair of clamp jaws are spaced apart.

9. The clamp meter of claim 8 wherein the lever is integrally formed with said at least one rigid clamp jaw.

10. The clamp meter of claim 8 further comprising a selector knob disposed on the housing, for selecting a measurement mode.

11. The clamp meter of claim 10 wherein the measurement mode comprises a voltage mode, a resistance mode, and a current mode.

12. The clamp meter of claim 10 wherein the selector knob extends beyond the housing.

13. The clamp meter of claim 10 further comprising two jacks for connecting two testing probes for acquiring inputs.

14. A clamp type meter for measuring at least one electrical parameter, said meter comprising:

a) a housing including at least first and second faces which are generally perpendicular to one another;

b) a first rigid clamp jaw extending out from the housing;

c) a second rigid clamp jaw extending out from the housing, the first and second clamp jaws defining a clamp plane, the first rigid clamp jaw being pivotally movable only in the jaw plane;

d) a first display disposed on the first face of the housing; and e) a second display disposed on the second face of the housing.

15. The clamp meter of claim 14 further comprising a lever attached to the first rigid clamp jaw for moving the first rigid clamp jaw from a closed position wherein the first and second rigid clamp jaws contact one another to an open position wherein the first and second rigid clamp jaws are spaced apart.

16. The clamp meter of claim 15 wherein the housing includes a third face and the lever extends from the third face of the housing.

17. The clamp meter of claim 14 further comprising a selector knob disposed on the housing, for selecting a measurement mode.

18. The clamp meter of claim 17 wherein the measurement mode comprises at least a current mode.

19. The clamp meter of claim 17 wherein the selector knob extends beyond the housing.

20. The clamp meter of claim 17 further comprising two apertures for connecting two testing probes for acquiring signals.

* * * * *